United States Patent
Tahara et al.

(10) Patent No.: US 9,177,781 B2
(45) Date of Patent: Nov. 3, 2015

(54) PLASMA PROCESSING METHOD AND MANUFACTURING METHOD OF SEMICONDUCTOR DEVICE

(75) Inventors: Shigeru Tahara, Nirasaki (JP); Eiichi Nishimura, Nirasaki (JP); Fumiko Yamashita, Nirasaki (JP); Hiroshi Tomita, Yokohama (JP); Tokuhisa Ohiwa, Yokkaichi (JP); Hisashi Okuchi, Yokohama (JP); Mitsuhiro Omura, Kawasaki (JP)

(73) Assignees: TOKYO ELECTRON LIMITED, Tokyo (JP); KABUSHIKI KAISHA TOSHIBA, Tokyo (JP)

( * ) Notice: Subject to any disclaimer, the term of this patent is extended or adjusted under 35 U.S.C. 154(b) by 426 days.

(21) Appl. No.: 13/178,759

(22) Filed: Jul. 8, 2011

(65) Prior Publication Data
US 2012/0009786 A1    Jan. 12, 2012

(30) Foreign Application Priority Data

Jul. 9, 2010 (JP) ................................ P2010-156543
Jun. 10, 2011 (JP) ................................ P2011-129790

(51) Int. Cl.
*H01L 21/02* (2006.01)

(52) U.S. Cl.
CPC ................................ *H01L 21/02071* (2013.01)

(58) Field of Classification Search
USPC .................... 438/696, 709, 720, 722, 734; 257/E21.226
See application file for complete search history.

(56) References Cited

U.S. PATENT DOCUMENTS

| | | | |
|---|---|---|---|
| 5,575,888 A | 11/1996 | Kosakowski et al. | |
| 6,207,583 B1 * | 3/2001 | Dunne et al. | 438/725 |
| 6,297,147 B1 * | 10/2001 | Yang et al. | 438/627 |
| 8,323,521 B2 * | 12/2012 | Zhao et al. | 216/59 |
| 2002/0028855 A1 * | 3/2002 | Chung et al. | 438/765 |
| 2004/0118697 A1 * | 6/2004 | Wen et al. | 205/215 |
| 2005/0087893 A1 * | 4/2005 | Chung et al. | 257/E21.311 |

FOREIGN PATENT DOCUMENTS

| | | |
|---|---|---|
| JP | 10-178014 | 6/1998 |
| JP | 2000-82693 | 3/2000 |

OTHER PUBLICATIONS

Office Action mailed Jun. 26, 2015 in Taiwanese Application No. 100123544 (w/English translation).

* cited by examiner

*Primary Examiner* — Scott B Geyer
(74) *Attorney, Agent, or Firm* — Oblon, McClelland, Maier & Neustadt, L.L.P.

(57) ABSTRACT

A plasma processing method in which performing a plasma etching on metal layers formed on a substrate is conducted to form a pattern having the metal layers in a stacked structure, and then a deposit containing a metal that forms the metal layers and being deposited on a sidewall portion of the pattern is removed, the method includes: forming a protective layer by forming an oxide or chloride of the metal on sidewall portions of the metal layers; removing the deposit by applying a plasma of a gas containing fluorine atoms; and reducing the oxide or chloride of the metal by applying a plasma containing hydrogen after forming the protective layer and removing the deposit.

8 Claims, 2 Drawing Sheets

US 9,177,781 B2

PLASMA PROCESSING METHOD AND MANUFACTURING METHOD OF SEMICONDUCTOR DEVICE

CROSS-REFERENCE TO RELATED APPLICATIONS

This application is based upon and claims the benefit of priority from the prior Japanese Patent Applications No. 2010-156543 filed on Jul. 9, 2010 and No. 2011-129790 filed on Jun. 10, 2011; the entire contents which are incorporated herein by reference.

FIELD

The present invention relates to a plasma processing method and a manufacturing method of a semiconductor device.

BACKGROUND

In a manufacturing process of a semiconductor device, plasma processing such as etching processing has been conventionally performed on a substrate such as a semiconductor wafer using a plasma and, for instance, formation of a stacked pattern structure having layers containing a metal such as titanium (Ti) and tungsten (W) has been conducted with the use of plasma etching. Note that as a technology to perform etching on tungsten (W), there has been known one that uses a gas obtained by mixing a gas containing fluorine atoms, a gas containing chlorine atoms, and an oxygen gas, or the like, for example (refer to Reference 1, for instance).

When the pattern structure containing the metal such as titanium (Ti) and tungsten (W) is formed by using the plasma etching as described above, a deposit (deposited substance) containing the metal sometimes remains on a sidewall of the pattern. If formation of CVD film is carried out in a post-process in a state where the deposit containing the metal still remains, the deposit containing the metal sometimes becomes a cause (nucleus) of abnormal growth. For this reason, there is a need to remove the deposit containing the metal.

As a method of removing a deposit containing a metal generated at a time of performing etching on a metal film, a method using wet cleaning has been known. Further, there has been known a method of removing a deposit containing a metal using heating processing or gas processing using a fluorine-containing gas (refer to Reference 2, for instance).

Reference 1: JP-A 10-178014 (KOKAI)
Reference 2: JP-A 2000-082693 (KOKAI)

Among the above-described methods of removing the deposit containing the metal generated at the time of performing etching on the metal film, the method using the wet cleaning has a problem that a pattern collapse may occur.

Meanwhile, the method with the use of the heating processing or the gas processing using the fluorine-containing gas has a problem that a deposit capable of being removed is limited, and thus the removal cannot be conducted depending on deposits. Further, there is a problem that if a deposit which cannot be removed by the method with the use of the heating processing or the gas processing using the fluorine-containing gas is tried to be removed using a plasma, a metal layer included in a pattern structure is etched (side-etched), resulting in that the pattern becomes thin.

SUMMARY

The present invention was made to solve the conventional problems as described above, and an object thereof is to provide a plasma processing method and a manufacturing method of a semiconductor device capable of efficiently removing, with the use of dry processing, a deposit containing a metal deposited on a sidewall of a pattern, while suppressing thinning of pattern caused by side etching.

One aspect of the present invention is a plasma processing method in which performing a plasma etching on metal layers formed on a substrate is conducted to form a pattern having the metal layers in a stacked structure, and then a deposit containing a metal that forms the metal layers and being deposited on a sidewall portion of the pattern is removed, the method including: forming a protective layer by forming an oxide or chloride of the metal on sidewall portions of the metal layers; removing the deposit by applying a plasma of a gas containing fluorine atoms; and reducing the oxide or chloride of the metal by applying a plasma containing hydrogen after forming the protective layer and removing the deposit.

One aspect of the present invention is a manufacturing method of a semiconductor device having a deposit removing process in which performing a plasma etching on metal layers formed on a substrate is conducted to form a pattern having the metal layers in a stacked structure, and then a deposit containing a metal that forms the metal layers and being deposited on a sidewall portion of the pattern is removed, the deposit removing process, including: forming a protective layer by forming an oxide or chloride of the metal on sidewall portions of the metal layers; removing the deposit by applying a plasma of a gas containing fluorine atoms; and reducing the oxide or chloride of the metal by applying a plasma containing hydrogen after forming the protective layer and removing the deposit.

According to the present invention, it is possible to provide a plasma processing method and a manufacturing method of a semiconductor device capable of efficiently removing, with the use of dry processing, a deposit containing a metal deposited on a sidewall of a pattern, while suppressing thinning of pattern caused by side etching.

DESCRIPTION OF THE EMBODIMENTS

Figure 1:
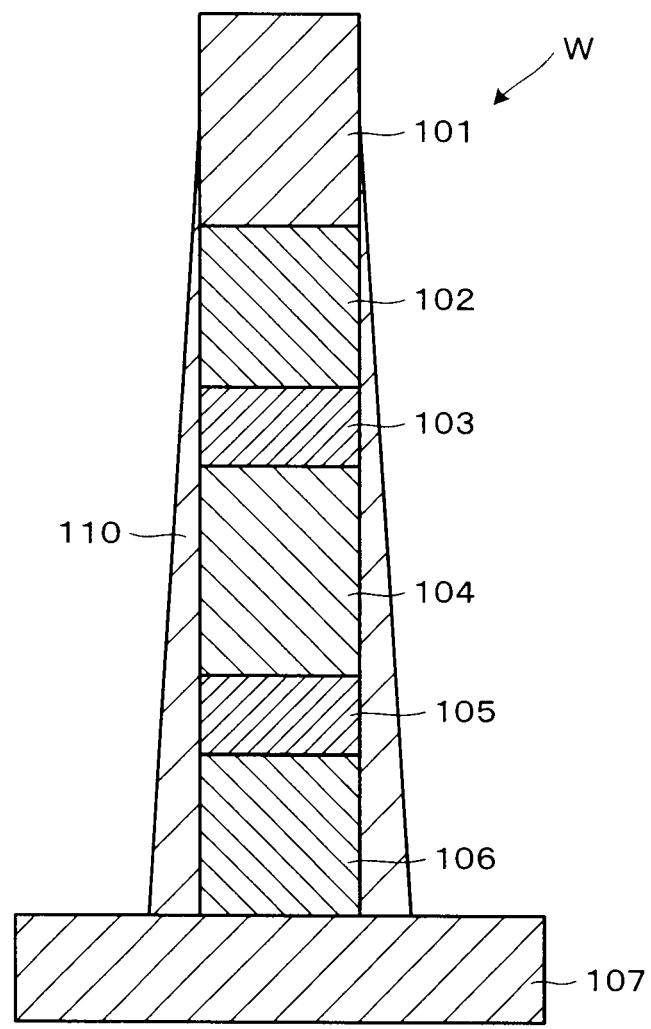
FIG. 1 is a view showing a cross-sectional structure of a semiconductor wafer according to an embodiment of a plasma processing method of the present invention.
Figure 2:
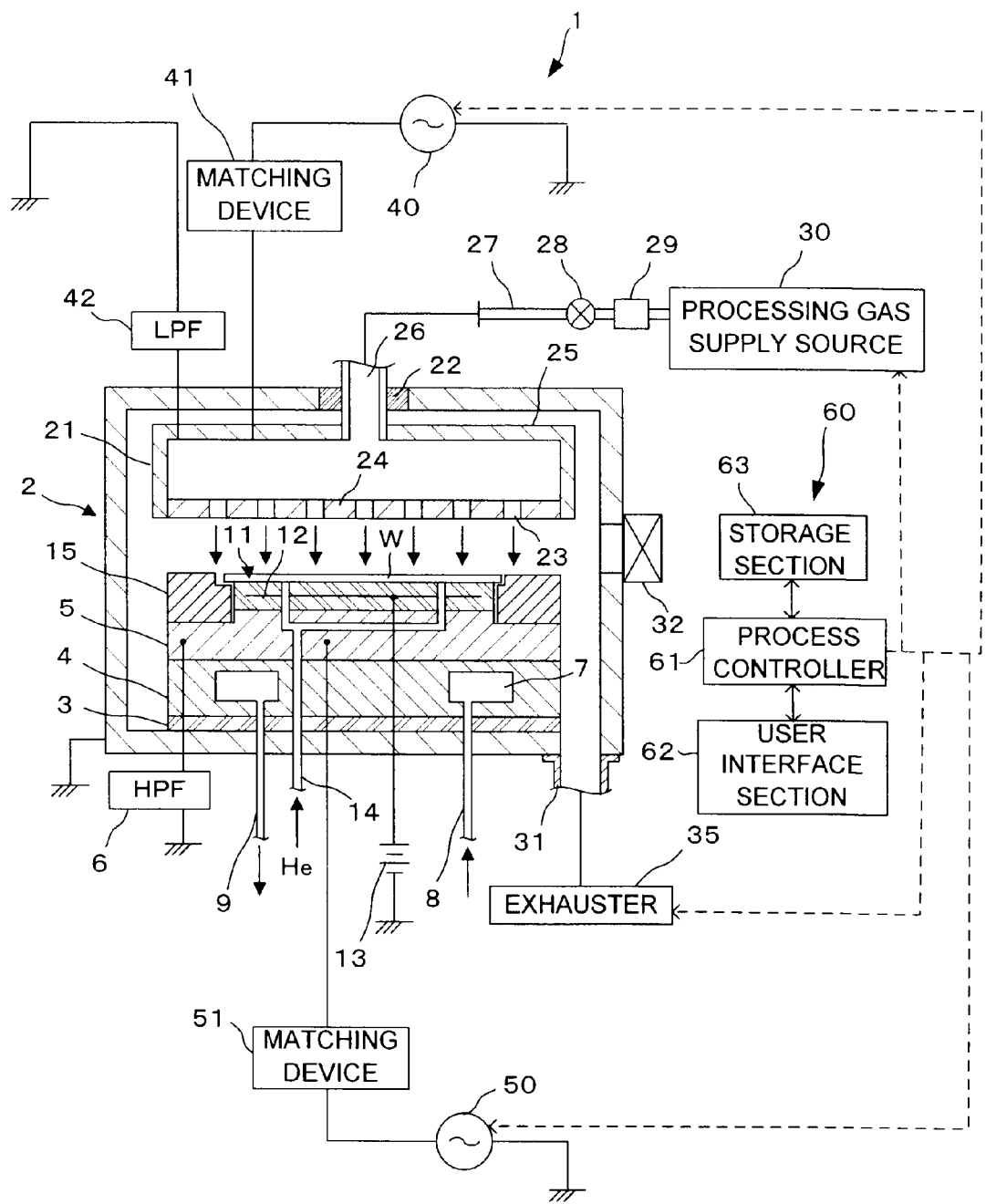
FIG. 2 is a view showing a schematic structure of an example of a plasma etching apparatus used in the embodiment of the present invention.

Hereinafter, an embodiment of the present invention will be explained with reference to the drawings. FIG. 1 is a view showing, in an enlarged manner, a cross-sectional structure of a semiconductor wafer as a substrate to be processed in a plasma processing method according to the present embodiment. Further, FIG. 2 is a view schematically showing a cross-sectional schematic structure of a plasma etching apparatus as a plasma processing apparatus used in the present embodiment. First, explanation will be made on a structure of the plasma etching apparatus with reference to FIG. 2.

A plasma etching apparatus 1 is structured as a capacitive-coupling type parallel plate etching apparatus in which electrode plates are opposed to and in parallel with each other one above the other and to which a plasma forming power supply is connected.

The plasma etching apparatus 1 has a vacuum processing chamber 2 formed in a circular cylindrical shape made of, for example, aluminum or the like with its surface being subjected to anodic oxidation processing, and the vacuum processing chamber 2 is grounded. A substantially circular cylindrical susceptor supporting table 4 is provided at a bottom in the vacuum processing chamber 2 with an insulating plate 3 made of ceramic or the like intervening therebetween, for mounting a substrate to be processed, which is, for example, a semiconductor wafer W thereon. Further, on the susceptor supporting table 4, a susceptor (mounting table) 5 is provided which constitutes a lower electrode. To the susceptor 5, a high-pass filter (HPF) 6 is connected.

Inside the susceptor supporting table 4, a refrigerant chamber 7 is provided, and in the refrigerant chamber 7, a refrigerant is introduced via a refrigerant introduction pipe 8, circulated, and discharged from a refrigerant discharge pipe 9. Further, the cold heat of the refrigerant is transferred via the susceptor 5 to the semiconductor wafer W, which controls the semiconductor wafer W to a desired temperature.

The susceptor 5 is formed such that its upper center portion is formed in a projecting circular disc shape on which an electrostatic chuck 11 having a circular shape similar to the semiconductor wafer W and having substantially the same diameter as that of the semiconductor wafer W is provided. The electrostatic chuck 11 is made of an insulating material with an electrode 12 disposed therein. A direct-current voltage of, for example, 1.5 kV is then applied from a direct-current power supply 13 connected to the electrode 12 to electrostatically attract the semiconductor wafer W by, for example, Coulomb force.

The insulating plate 3, the susceptor supporting table 4, the susceptor 5 and the electrostatic chuck 11 are formed with a gas passage 14 for supplying a heat-transfer medium (for example, He gas or the like) to a rear surface of the semiconductor wafer W, and via the heat-transfer medium, the cold heat of the susceptor 5 is designed to be transferred to the semiconductor wafer W to keep the semiconductor wafer W at a predetermined temperature.

At a peripheral edge portion of an upper end of the susceptor 5, an annular focus ring 15 is located to surround the semiconductor wafer W mounted on the electrostatic chuck 11. The focus ring 15 has a function to improve an in-plane uniformity of etching.

Above the susceptor 5, an upper electrode 21 is provided opposed to and in parallel with the susceptor 5. The upper electrode 21 is supported by an upper portion of the vacuum processing chamber 2 via an insulating material 22. The upper electrode 21 is composed of an electrode plate 24 and an electrode supporter 25 made of a conductive material which supports the electrode plate 24. The electrode plate 24 is formed of, for instance, an electric conductor or semiconductor, and has a number of discharge holes 23. The electrode plate 24 forms an opposed surface to the susceptor 5.

A gas introduction port 26 is provided at the center of the electrode supporter 25 in the upper electrode 21, and a gas supply pipe 27 is connected to the gas introduction port 26. Further to the gas supply pipe 27, a processing gas supply source 30 is connected via a valve 28 and a mass-flow controller 29. From the processing gas supply source 30, a processing gas for plasma processing is supplied.

An exhaust pipe 31 is connected to the bottom of the vacuum processing chamber 2, and an exhauster 35 is connected to the exhaust pipe 31. The exhauster 35 includes a vacuum pump such as a turbo molecule pump and is structured to be able to evacuate the vacuum processing chamber 2 to a predetermined reduced pressure atmosphere, for example, a predetermined pressure equal to or lower than 1 Pa. Further, a gate valve 32 is provided on a sidewall of the vacuum processing chamber 2 so that the semiconductor wafer W is carried to/from an adjacent load lock chamber (not shown) with the gate valve 32 opened.

A first high-frequency power supply 40 is connected to the upper electrode 21, and a matching device 41 is interposed in its power supply line. Further, a low-pass filter (LPF) 42 is connected to the upper electrode 21. The first high-frequency power supply 40 is structured to supply a high-frequency power with a frequency in a range of 50 to 150 MHz, for instance. Application of high-frequency power with such a high frequency allows high-density plasma to be formed in a preferable dissociation state in the vacuum processing chamber 2.

A second high-frequency power supply 50 is connected to the susceptor 5 as the lower electrode, and a matching device 51 is interposed in its power supply line. The second high-frequency power supply 50 is structured to supply a high-frequency power with a frequency in a range lower than that of the first high-frequency power supply 40. Application of high-frequency power with a frequency in such range allows an appropriate ion action to be provided to the semiconductor wafer W being the substrate to be processed without damage thereto. As the frequency of the second high-frequency power supply 50, a frequency of about 20 MHz or less is used, for example.

The operation of the plasma etching apparatus 1 structured as above is comprehensively controlled by a control unit 60. The control unit 60 has a process controller 61 which includes a CPU to control the sections and devices in the plasma etching apparatus 1, a user interface section 62 and a storage section 63 provided therein.

The user interface section 62 is constituted of a keyboard through which a process manager performs operation of inputting commands to manage the plasma etching apparatus 1, a display which visualizes and displays the operating state of the plasma etching apparatus 1, and so on.

The storage section 63 stores recipes in which a control program (software), processing condition data and so on are stored for realizing various kinds of processing executed in the plasma etching apparatus 1 by control of the process controller 61. Further, any of the recipes is called from the storage section 63 under an instruction through the user interface section 62 or the like when necessary, and then executed by the process controller 61, so that desired processing is performed in the plasma etching apparatus 1 under the control of the process controller 61. Further, as the recipe including the control program, the processing condition data, and so on, one stored in a computer readable computer storage medium (for example, a hard disk, CD, flexible disk, semiconductor memory, or the like) can be used, or one that is transmitted as needed from another apparatus, for example, via a dedicated line can be used on-line.

When plasma etching is performed on the semiconductor wafer W using the plasma etching apparatus 1 structured as above, the semiconductor wafer W is first carried from the not-shown load lock chamber into the vacuum processing chamber 2 after the gate valve 32 is opened, and then mounted on the electrostatic chuck 11. Further, when the direct-current power supply 13 applies the direct-current voltage, the semiconductor wafer W is electrostatically attracted onto the electrostatic chuck 11. Subsequently, the gate valve 32 is closed, and the exhauster 35 evacuates the vacuum processing chamber 2 to a predetermined degree of vacuum.

Thereafter, the valve 28 is opened so that a predetermined processing gas is introduced from the processing gas supply source 30 with its flow rate being adjusted by the mass-flow controller 29, into a hollow portion in the upper electrode 21 bypassing through the processing gas supply pipe 27, the gas introduction port 26, and further passes through the discharge holes 23 in the electrode plate 24 to be uniformly discharged to the semiconductor wafer W as indicated by arrow marks in FIG. 2.

Further, the pressure in the vacuum processing chamber 2 is maintained at a predetermined pressure. Thereafter, a high-frequency power with a predetermined frequency is applied from the first high-frequency power supply 40 to the upper electrode 21. This causes a high-frequency electric field between the upper electrode 21 and the susceptor 5 as the lower electrode to dissociate the processing gas into plasma.

On the other hand, a high-frequency power with a frequency lower than that of the above-described first high-frequency power supply 40 is applied, according to need, from the second high-frequency power supply 50 to the susceptor 5 being the lower electrode. This draws ions in the plasma into the susceptor 5 side, so that ion assist enhances the anisotropy of the etching. Note that in respective examples of plasma processing to be described later, the application of high-frequency power from the second high-frequency power supply 50 is not conducted.

Further, after completion of the predetermined plasma etching processing, the supply of high-frequency power and the supply of processing gas are stopped, and the semiconductor wafer W is carried out of the vacuum processing chamber 2 in a procedure reverse of the above described procedure.

Next, explanation will be made on a cross-sectional structure of the semiconductor wafer W according to the present embodiment with reference to FIG. 1. As shown in FIG. 1, on the semiconductor wafer W, a silicon dioxide ($SiO_2$) layer 101, a tungsten (W) layer 102, a titanium nitride (TiN) layer 103, a polysilicon (Poly-Si) layer 104, a titanium nitride (TiN) layer 105, a tungsten (W) layer 106, and a silicon dioxide ($SiO_2$) layer 107 are formed so as to be stacked in this order from the top.

The silicon dioxide ($SiO_2$) layer 101, the tungsten (W) layer 102, the titanium nitride (TiN) layer 103, the polysilicon (Poly-Si) layer 104, the titanium nitride (TiN) layer 105, and the tungsten (W) layer 106 described above are patterned by plasma etching to form a predetermined pattern, and on a sidewall portion of the pattern, a deposit (deposited substance) 110 is deposited. The plasma etching for performing such patterning can be conducted by using the plasma etching apparatus 1 shown in FIG. 2, for instance.

The deposit 110 contains a residue at the time of performing plasma etching on the silicon dioxide ($SiO_2$) layer 101, the tungsten (W) layer 102, the titanium nitride (TiN) layer 103, the polysilicon (Poly-Si) layer 104, the titanium nitride (TiN) layer 105, and the tungsten (W) layer 106. Specifically, the deposit 110 contains tungsten and titanium being metals, and a main component thereof is tungsten (oxide).

When CVD is performed in a post-process in a state where the aforementioned deposit 110 still remains, the deposit 110 becomes a cause (nucleus) of abnormal growth. For this reason, there is a need to remove the deposit 110. If wet cleaning is employed at the time of removing the deposit 110, a pattern collapse may occur. Further, a method with the use of heating processing or gas processing using a fluorine-containing gas cannot remove the deposit 110 generated at the time of performing plasma etching on the above-described stacked structure.

Meanwhile, if the semiconductor wafer is subjected to a plasma using a gas containing fluorine, which is, for example, a gas of $NF_3$, $CHF_3$, $CH_2F_2$ or the like, although the deposit 110 can be removed, respective layers in the pattern, particularly, the tungsten (W) layer 102, the tungsten (W) layer 106 being the metal layers are side-etched, resulting in that the pattern becomes thin.

Actually, as a comparative example 1, the parallel plate type plasma processing apparatus shown in FIG. 2 was used to remove the deposit 110 by generating a plasma in a processing chamber under the following conditions:
  processing gas: $NF_3/O_2/Ar=20/30/180$ sccm;
  pressure: 1.33 Pa (10 mTorr);
  high-frequency power (upper electrode/lower electrode): 300/0 W;
  temperature (center/edge/refrigerant): 40/40/30° C.; and
  period of time: 30 seconds.

As a result of performing the aforementioned plasma processing, the amount of deposit 110 was decreased, but, the polysilicon (Poly-Si) layer 104, the silicon dioxide ($SiO_2$) layer 101, and particularly the tungsten (W) layer 102, the tungsten (W) layer 106 that compose the pattern were side-etched, resulting in that the pattern became thin.

Accordingly, in the present embodiment, a protective layer forming step of forming, on a sidewall portion of the pattern, particularly, on sidewall portions of the metal layers (the tungsten (W) layer 102, the tungsten (W) layer 106), a protective layer made of an oxide or chloride of the metal (W) that forms the metal layers, and a deposit removing step of removing the deposit 110 by applying a plasma of a gas containing fluorine atoms, are conducted. Accordingly, the deposit 110 is removed while preventing the pattern from being thinned by the side etching. Further, after the above-described protective layer forming step and deposit removing step, there is conducted a reduction step of reducing the oxide or chloride formed on the sidewall portion of the pattern by applying a plasma containing hydrogen.

The protective layer forming step and the deposit removing step can be performed by any of a method (cycle processing) in which these steps are alternately repeated to be performed a plurality of times, a method in which these steps are simultaneously conducted, and a method in which the protective layer forming step is first conducted once and then the deposit removing step is conducted.

In the cycle processing in which the protective layer forming step and the deposit removing step are alternately repeated to be performed a plurality of times, plasma processing in which a plasma of an oxygen gas is applied to generate the oxide of the metal that forms the metal layers, can be used in the protective layer forming step. Further, in the protective layer forming step in the cycle processing, it is also possible to use plasma processing in which a plasma of a gas containing chlorine atoms such as a chlorine gas is applied to generate the chloride of the metal that forms the metal layers.

When the protective layer forming step and the deposit removing step are simultaneously conducted, since the deposit removing step is performed through the plasma processing, the protective layer forming step is also conducted through the plasma processing. Accordingly, the protective layer forming step uses the plasma processing in which the plasma of the oxygen gas is applied to generate the oxide of the metal that forms the metal layers, or the plasma processing in which the plasma of the gas containing chlorine atoms such as the chlorine gas is applied to generate the chloride of the metal that forms the metal layers.

When the method in which the protective layer forming step is performed only once and then the deposit removing step is conducted is used, the protective layer forming step can also be conducted through the plasma processing as described above, and further, it is not limited to the plasma processing and, for example, it can also be conducted through a method in which the semiconductor wafer W is heated to a predetermined temperature, which is, for instance, 250° C. under an oxygen gas atmosphere, and the oxide of the metal that forms the metal layers is generated through thermal oxidation.

In the deposit removing step, at least any one kind of, for example, $NF_3$, $CHF_3$, $CH_2F_2$ and the like can be used as the gas containing fluorine atoms. Further, as the metal contained in the pattern, there can be cited the aforementioned tungsten (W) and titanium (Ti).

As an example 1, there was conducted the cycle processing in which the protective layer forming step and the deposit removing step are alternately repeated to be performed a plurality of times, under the following conditions:
(protective layer forming step)
processing gas: $O_2$/Ar=200/800 sccm;
pressure: 13.3 Pa (100 mTorr);
high-frequency power (upper electrode/lower electrode): 300/0 W;
temperature (center/edge/refrigerant): 60/60/30° C.;
period of time: 10 seconds;
(deposit removing step)
processing gas: $NF_3$/$O_2$/Ar=8/200/800 sccm;
pressure: 13.3 Pa (100 mTorr);
high-frequency power (upper electrode/lower electrode): 300/0 W;
temperature (center/edge/refrigerant): 60/60/30° C.; and
period of time: 5 seconds.

The above-described cycle processing was repeatedly conducted 4 times in which the total period of time of the deposit removing step was set to 20 seconds.

Further, as a comparative example 2, only the above-described deposit removing step was continuously performed for 20 seconds.

When the above-described example 1 and comparative example 2 were compared, it was confirmed that they both have a maximum film thickness of the remaining deposit of 7 nm, and thus they both have substantially the same removing speed of the deposit.

Further, a pattern width (CD) of a tungsten portion of the pattern structure shown in FIG. 1 was 20.3 nm in the example 1, and was 18.5 nm in the comparative example 2, and accordingly, in the example 1, it was apparent that the thinning of pattern caused by the side etching of the tungsten portion was suppressed, compared with the comparative example 2.

As in the above-described example 1, by conducting the protective layer forming step using the oxygen plasma between the deposit removing steps using the fluorine plasma, it was possible to make the speed of removing the deposit to be equal to the speed at the time of performing only the deposit removing step while maintaining the CD of the pattern structure, and in some cases, it was possible to accelerate the speed. Note that a portion in which the removing speed can be accelerated in the deposit may contain an organic matter. Further, since the deposit is oxidized in the first place, it is conceivable that the speed of removing the deposit in the deposit removing step does not slow down even when the protective layer forming step through oxidizing processing is added.

Next, as an example 2 in which the protective layer forming step and the deposit removing step are simultaneously conducted, the plasma processing was performed under the following conditions:
The conditions were:
processing gas: $CHF_3$/$O_2$/$N_2$=4/200/500 sccm;
pressure: 13.3 Pa (100 mTorr);
high-frequency power (upper electrode/lower electrode): 300/0 W;
temperature (center/edge/refrigerant): 60/60/30° C.; and
period of time: 144 seconds.

In the above-described example 2, a flow rate ratio of $O_2$/$CHF_3$ was set to 50. As a comparative example 3 with respect to the example 2, plasma processing was conducted by using a processing gas: $CHF_3$/$O_2$/$N_2$=4/100/500 sccm, to set a flow rate ratio of $O_2$/$CHF_3$ to 25. When these example 2 and comparative example 3 were compared, in the comparative example 3, although it was possible to remove the deposit, the pattern width of the tungsten portion of the structure shown in FIG. 1 became thin, resulting in that a pattern collapse occurred. On the contrary, in the example 2, it was possible to remove the deposit, and besides, no pattern collapse occurred.

As is apparent from the above-described example 2 and comparative example 3, when the protective layer forming step and the deposit removing step are simultaneously conducted, the flow rate ratio of the oxygen gas to the gas containing fluorine atoms (flow rate of oxygen gas/flow rate of gas containing fluorine atoms) is preferably set to greater than 25, and is more preferably set to about 50.

As an example 3, there was conducted the cycle processing in which the protective layer forming step and the deposit removing step are alternately repeated to be performed a plurality of times, under the following conditions:
(protective layer forming step)
processing gas: $Cl_2$/$N_2$=160/500 sccm;
pressure: 13.3 Pa (100 mTorr);
high-frequency power (upper electrode/lower electrode): 300/0 W;
temperature (center/edge/refrigerant): 60/60/30° C.;
period of time: 5 seconds;
(deposit removing step)
processing gas: $NF_3$/$O_2$/$N_2$=4/200/500 sccm;
pressure: 13.3 Pa (100 mTorr);
high-frequency power (upper electrode/lower electrode): 300/0 W;
temperature (center/edge/refrigerant): 60/60/30° C.; and
period of time: 5 seconds.

When the above-described cycle processing was repeatedly conducted 4 times in which the total period of time of the deposit removing step was set to 20 seconds, it was possible to remove the deposit at a speed similar to that of the aforementioned comparative example 1. Further, the pattern width (CD) of the tungsten portion of the structure shown in FIG. 1 was 19.8 nm, which was substantially the same as the width of the aforementioned example 1. Therefore, it was confirmed that in the example 3, it is possible to efficiently remove the deposit while effectively suppressing the thinning of pattern of the tungsten portion caused by the side etching.

As described above, also in the case of forming the protective layer of the chloride of the metal using the plasma of the $Cl_2$ gas in the protective layer forming step, by setting, in the same manner as the case of forming the protective layer of the oxide of the metal using the plasma of the oxygen gas, a ratio of a flow rate of the $Cl_2$ gas to a flow rate of the gas containing fluorine atoms such as the $NF_3$ gas (flow rate of $Cl_2$ gas/flow rate of $NF_3$ gas) to a high value, which is, for instance, greater than 25, and is about 50, for example, the protective layer forming step and the deposit removing step can be simultaneously performed.

As an example 4, there was conducted an experiment to confirm an effect of a case where the protective layer forming step through thermal oxidation was performed once before the deposit removing step, under the following conditions:

(protective layer forming step)
processing gas: $O_2/N_2$=3000/600 sccm;
pressure: 172.9 Pa (1300 mTorr);
temperature: 250° C.;
period of time: 25 seconds;
(deposit removing step)
processing gas (1): $CHF_3/N_2/O_2$=4/200/500 sccm;
processing gas (2): $N_2/Cl_2$=500/160 sccm;
pressure: 13.3 Pa (100 mTorr);
high-frequency power (upper electrode/lower electrode): 300/0 W;
temperature (center/edge/refrigerant): 60/60/30° C.; and
period of time: corresponding to 18 cycles, each cycle including 8 seconds of application of processing gas (1) and 5 seconds of application of processing gas (2).

The protective layer forming step in the above-described example 4 forms the protective layer through thermal oxidation in which the semiconductor wafer is heated in an oxygen atmosphere. Further, as a comparative example 4, only the deposit removing step which is the same as that of the above-described example 4 was conducted, without performing the aforementioned protective layer forming step. When these example 4 and comparative example 4 were compared, it was confirmed that in the example 4, it was possible to efficiently remove the deposit while suppressing a decrease in the pattern width (CD) of the tungsten portion of the structure shown in FIG. 1 especially in the portion where the pattern is densely formed, compared with the comparative example 4.

Note that in the above-described examples 1 to 4, the $CHF_3$ gas, the $NF_3$ gas were used as the gas containing fluorine atoms, but, a similar result was achieved also in a case of using another gas containing fluorine atoms such as, for example, $CH_2F_2$ gas.

Further, in the above-described examples 1 to 4, Ar or $N_2$ was used as a diluent gas, but, it is also possible to use another inert gas such as, for example, He.

Next, explanation will be made on an example 5 regarding the reduction processing. When a state of a semiconductor wafer (blanket wafer having a tungsten layer formed on a surface thereof) after being subjected to the same processing as the deposit removing step in the above-described example 4 was measured by an XPS, an abundance ratio of tungsten (W) to oxygen (O) (W/O) was 0.72, since tungsten was oxidized. Further, halogen remained, and 5.2% of Cl and 1.9% of F existed. When the wet cleaning using 0.5% of dilute hydrofluoric acid (DHF) was performed (cleaning using dilute hydrofluoric acid was performed for 1 minute, and then cleaning using distilled water (DIW) was performed for 1 minute) on the wafer, the abundance ratio of tungsten (W) to oxygen (O) (W/O) became 1.61, and 0% of Cl and F existed.

In the example 5, reduction processing using a $H_2$ plasma was performed on the semiconductor wafer (blanket wafer having the tungsten layer formed on the surface thereof) after being subjected to the same processing as the deposit removing step in the above-described example 4, under the following conditions:
processing gas: $H_2$/Ar=40/960 sccm;
pressure: 106.4 Pa (800 mTorr);
high-frequency power (upper electrode/lower electrode): 300/0 W;
temperature: 60° C.; and
period of time: 1 minute.

The semiconductor wafer after being subjected to the reduction processing using the $H_2$ plasma described above had the abundance ratio of tungsten (W) to oxygen (O) (W/O) of 1.58, and 0% of Cl and F, and thus the wafer could be restored to substantially the same state as that of the case of performing the wet cleaning using dilute hydrofluoric acid (DHF).

As an example 6, there was conducted the cycle processing in which the protective layer forming step and the deposit removing step are alternately repeated to be performed a plurality of times, under the following conditions:
(protective layer forming step)
processing gas: $cl_2/Ar/O_2$=250/500/50 sccm;
pressure: 13.3 Pa (100 mTorr);
high-frequency power (upper electrode/lower electrode): 150/0 W;
temperature (center/edge/refrigerant): 60/60/20° C.;
period of time: 5 seconds;
(deposit removing step)
processing gas: $CHF_3/O_2$/Ar=4/300/500 sccm;
pressure: 13.3 Pa (100 mTorr);
high-frequency power (upper electrode/lower electrode): 150/0 W;
temperature (center/edge/refrigerant): 60/60/20° C.; and
period of time: 8 seconds.

The above-described cycle processing was repeatedly conducted 30 times. In the above-described protective layer forming step, $WOCl_4$ is formed as a protective layer on the surface of tungsten. Also in the example 6, it was possible to remove the deposit. Further, the pattern width (CD) of the tungsten portion of the structure shown in FIG. 1 was 21.8 nm, and thus it was possible to effectively suppress the thinning of pattern of the tungsten portion caused by the side etching. Further, in the example 6, since the $N_2$ gas is not used as the processing gas, it is possible to prevent a generation of particles (which increase with time) resulting from deliquescent $NH_4F$ and $NH_4Cl$.

As described above, according to the present embodiment and the examples, it is possible to efficiently remove, with the use of dry processing, a deposit containing a metal deposited on a sidewall of a pattern, while suppressing thinning of pattern caused by side etching. Note that the present invention is not limited to the above-described embodiment and examples, and various modifications can be made.

What is claimed is:

1. A plasma processing method of removing a deposit on a sidewall portion of a pattern of having metal layers in a stacked structure on a substrate, the method comprising:
   preparing the substrate with the pattern having metal layers in a stacked structure formed by dry processing, the stacked structure having a sidewall on a sidewall portion of which a deposit is deposited, the deposit containing at least one of metals of the metal layers;
   subjecting the stacked structure having said deposit to a protective layer forming step in which an oxide or chloride of the at least one of the metals is formed on the sidewall of the stacked structure having said deposit;
   applying a plasma of a gas containing fluorine atoms to remove the deposit; and
   applying a plasma containing hydrogen after forming the protective layer and removing the deposit, so as to reduce the oxide or chloride of the at least one of the metals.

2. The plasma processing method according to claim 1,
   wherein the forming an oxide or chloride of the one of the metals comprises applying a plasma of an oxygen gas to form the oxide of the one of the metals or applying a chlorine plasma to form the chloride of the one of the metals,
   the forming an oxide or chloride of the one of the metals on the sidewall of the stacked structure having said deposit and applying a plasma of a gas containing fluorine atoms are alternately repeated to be performed a plurality of times, and the applying a plasma containing hydrogen to reduce the oxide or chloride of the one of the metals is performed thereafter.

3. The plasma processing method according to claim 1, wherein a plasma of an oxygen gas is applied to form the oxide of the metal or a plasma of a chlorine gas is applied to form the chloride of the metal in forming the protective layer, forming the protective layer and removing the deposit are simultaneously conducted, and a ratio of a flow rate of the oxygen gas or the chlorine gas to a flow rate of the gas containing fluorine atoms (flow rate of oxygen gas or chlorine gas/flow rate of gas containing fluorine atoms) is set to greater than 25.

4. The plasma processing method according to claim 1, wherein the substrate is heated in an oxygen gas atmosphere to form the oxide of forming the metal layer, and forming the protective layer is performed only once before the removing deposit.

5. The plasma processing method according to claim 1, wherein the gas containing fluorine atoms is at least any one of $NF_3$, $CHF_3$ and $CH_2F_2$.

6. The plasma processing method according to claim 1, wherein the metal layers contain tungsten.

7. The plasma processing method according to claim 1, wherein the metal layers contain titanium.

8. A manufacturing method of a semiconductor device, comprising:

forming metal layers on a substrate;

performing a plasma etching on the metal layers to form a pattern having the metal layers in a stacked structure formed by dry processing on the substrate, the stacked structure having a sidewall on a sidewall portion of which a deposit is deposited, the deposit containing at least one of metals of the metal layers;

subjecting the stacked structure having said deposit to a protective layer forming step in which an oxide or chloride of the at least one of the metals is formed on the sidewall of the stacked structure having said deposit;

applying a plasma of a gas containing fluorine atoms to remove the deposit; and applying a plasma containing hydrogen, after forming the protective layer and removing the deposit, so as to reduce the oxide or chloride of the metal.

* * * * *